Figure 1:
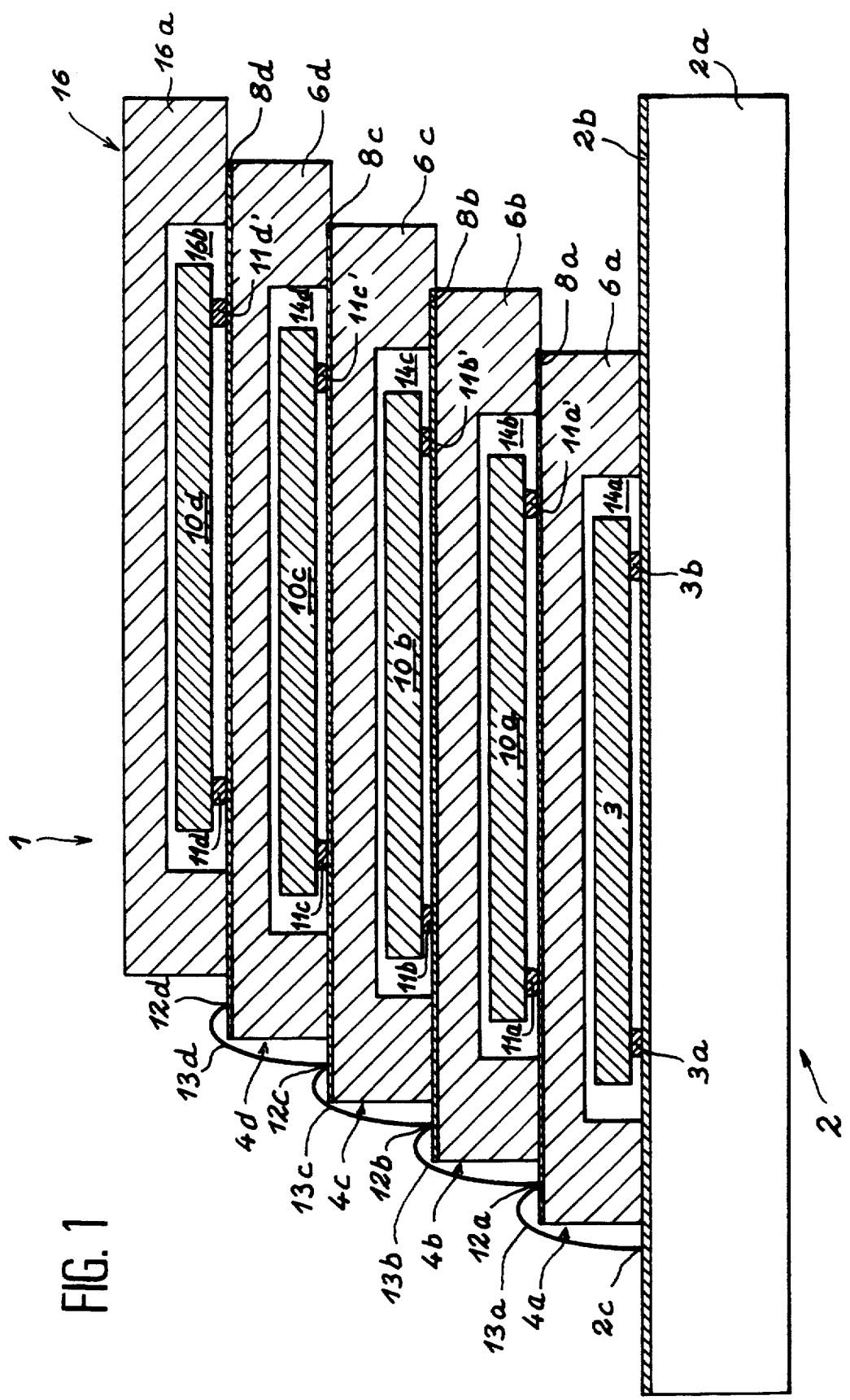

United States Patent [19]

Massit et al.

[11] Patent Number: 5,373,189

[45] Date of Patent: Dec. 13, 1994

[54] THREE-DIMENSIONAL MULTICHIP MODULE

[75] Inventors: Claude Massit, Ismier; Gérard Nicolas, Voreppe, both of France

[73] Assignee: Commissariat A L'Energie Atomique, Paris, France

[21] Appl. No.: 99,663

[22] Filed: Jul. 30, 1993

[30] Foreign Application Priority Data

Aug. 13, 1992 [FR] France ............... 92 10003

[51] Int. Cl.$^5$ .................. H01L 23/02; H05K 7/00
[52] U.S. Cl. .................... 257/686; 257/704; 257/723; 361/735
[58] Field of Search ............ 257/685, 686, 723, 704; 361/735

[56] References Cited

U.S. PATENT DOCUMENTS

| 4,956,694 | 9/1990 | Eide | 257/686 |
|---|---|---|---|
| 5,019,943 | 5/1991 | Fassbender et al. | |
| 5,128,831 | 7/1992 | Fox, III et al. | 361/735 |
| 5,311,401 | 5/1994 | Gates et al. | 257/686 |
| 5,313,096 | 5/1994 | Eide | 257/686 |

FOREIGN PATENT DOCUMENTS

WO88/05251 7/1988 WIPO.

Primary Examiner—Gene M. Munson
Attorney, Agent, or Firm—Burns, Doane, Swecker & Mathis

[57] ABSTRACT

Three-dimensional multichip module.

The invention relates to a three-dimensional or 3D multichip module having a plurality of bidimensional, elementary electronic modules (4a-4d), each incorporating at least one chip (10a-10d), a support (6a-6d) on which is placed the chip and a conductive interconnection network or array (8a-8d) covering an upper surface of the support. These elementary modules are substantially superimposed in a displaced manner (in the form of a staircase) and are interconnected by means of their interconnection networks and connection pads (12a-12d) placed on those parts of the elementary modules not covered by the upper elementary module.

Application to the association of integrated circuits in microconnection technology.

4 Claims, 3 Drawing Sheets

THREE-DIMENSIONAL MULTICHIP MODULE

DESCRIPTION

The present invention relates to a three-dimensional multichip module. Such a module has numerous applications in the field of applied micro-connection technology, particularly in connection with the association of integrated circuits.

Throughout the following description the term "integrated circuit" will be understood to mean a package having centimetre dimensions with one or more chips, ensuring the functionalities of said integrated circuit. Each of these chips is made from a semiconductor material, such as silicon or gallium arsenide. On the surface of the chips are formed the elements necessary for its operation.

On the periphery of the chips, there are pads permitting the connection of said chips to interface circuits with the exterior. In the centre of the chips there are active zones having a plurality of electronic components, such as transistors, resistors, capacitors, etc. Interconnection circuits are produced on said chips in order to permit the connection of the electronic components to one another and to the chip connection pads.

Nowadays, the increase in the complexity of computer systems is such that it is necessary, for most integrated circuit manufacturers, to bring about a relative increase in the number of electronic components per surface unit of said integrated circuits.

In order to increase the integration of the electronic components, it is possible to reduce the geometries of each of the components forming the integrated circuit by defining submicron processes. However, such a method encounters physical limits, namely the miniaturization by wavelength of optical irradiation systems of the resins.

Another method for increasing the number of components per surface unit consists of increasing the elementary surface of the chips. Obviously this increase in the size of the chips is a disadvantage with regards to the space necessary for the integration of the integrated circuits in computer systems and with regards to manufacturing efficiency.

Another method consists of producing a multichip module.

One embodiment of such a multichip module consists of a monolithic technology module known as WAFER SCALE INTEGRATION. In such a multichip module, the integrated circuit is constituted by a silicon slice and the functionalities of the system are obtained by introducing redundant elements making it possible to replace defective elements.

According to another technology, namely hybrid technology, complex electronic functions are directly obtained on a silicon wafer or plate serving as an interconnection support. The active components, namely the chips, can be made from gallium arsenide and are directly connected to the silicon wafer by wire bonding, automatic transfer on band, etc.

These hybrid and monolithic technologies are more specifically described in the article entitled "LE CHIP CARRIER, support universel de pastilles àhaut niveau d'intégration", published in the journal ELECTRONIQUE INDUSTRIELLE, no. 31. Thus, these hybrid and monolithic technologies propose bidimensional multichip modules leading to better performance characteristics and to a higher system capacity. However, the surface of the integrated circuits often remains too large for increasingly powerful computer systems.

In addition, another method consists of using the third dimension for stacking the chips in order to reduce the surface of the integrated circuit and improve the frequency performance characteristics.

In an article entitled "3D INTERCONNECTION FOR ULTRA-DENSE MULTICHIP MODULES", (Proceedings ECTC 1990, Las Vegas, pp. 540–547) is described a three-dimensional multichip module consisting of an assembly by bonding of several chips having their interconnection wires between the silicon pads and an automatic transfer ribbon on band. This chip array is then sawn up in order to raise the section of the interconnection wires. Electrical contacting takes place on the section of the wires by the metallization of one or more faces of the cube constituted by the different chips.

Another 3D multichip module is described in the document entitled "HIGH DENSITY 3D PROCEEDING", written by John C. CARSON and Myles F. SUER, (WORKSHOP ON VLSI RECHARGING TECHNIC, June 1991, Villefranche/Mer), as well as the article entitled "3D IC PACKAGING MOVES CLOSER TO COMMERCIAL USE", written by J. Robert LINEBACK, in "ELECTRONIC WORLD NEWS", (May 1990). This 3D multichip module consists of an addition of a metallurgy on the passivation of the wafers in order to bring the interconnection lines of the chip pads towards the edge of each of said chips. The wafer is then sawn up and the chips are bonded to one another. On one or more sides of the cube produced by bonding together the chips a metallurgy is carried out making it possible to bring all the pads onto one face of the cube so that they can be mounted on a substrate (i.e. very frequently on a silicon plate) or in a package.

Such multichip modules effectively meet the requirement of maximum integration, but they suffer from the disadvantage of being technologically very difficult to produce. In addition, said modules have problems from the heat dissipation standpoint as a result of the confinement of the active circuits. In addition, such modules are only suitable for the interconnection of a single type of chip. Thus, such modules lead to the stacking of the same integrated circuit in the third dimension.

Another three-dimensional multichip module is described in the document entitled "TEXAS INSTRUMENT DEMONSTRATIONS", in the journal "AVIATION WEEK AND SPACE TECHNOLOGY" (February 1992). Thus, this article describes a 3D multichip module, i.e. a volume base module produced from bidimensional modules so as to perpendicularly interconnect and cool all the bidimensional modules. Such a multichip module suffers from the disadvantage of requiring the production of a specific machined block, where cards are perpendicularly interconnected.

WO-A-8 805 251 also proposes a three-dimensional multichip module. However, the assembly of the elementary modules on the base substrate takes place orthogonally, so that it is necessary to extend the interconnection network located on the upper face of the modules on one edge or slice of said module, which is expensive and difficult to carry out, as well as accurately aligning all the modules in order to obtain the requisite flatness for the assembly of said modules on the base substrate.

As said electrical assembly takes place on the entire surface of said substrate, it is impossible to check and, a fortiori, repair these connections.

U.S. Pat. No. 5,128,831 proposes another type of multichip module. However, the assembly of the elementary modules in this patent requires an electrical individualizing of each elementary module as a result of the type of connection by metallized holes, which has the consequence of using a different substrate type for each level, a drilling of holes followed by a surface metallization on the elementary modules and on the spacers and, following mechanical assembly, a filling of the said holes by a multiple metal.

The production of such a multichip module suffers from the disadvantage of requiring expensive operations for a relatively unreliable result.

The three-dimensional multichip module according to the invention meets the requirement of maximum integration of the electronic components and makes it possible to solve the problems referred to herein-before.

Throughout the remainder of the description, the terms "3D module", "3D multichip module" or "three-dimensional multichip module" will be used in arbitrary manner. manner.

More specifically, the invention relates to a multichip module, characterized in that it has a plurality of bidimensional, elementary electronic modules, each incorporating at least one chip, a support on which the chip is placed and a conductive interconnection network covering an upper surface of the support, said elementary modules being substantially superimposed and connected to one another by means of the interconnection networks.

On a lower face, the supports advantageously have a cavity with a size significantly larger than that of the chips, so that the support of a first elementary module can be fitted above the chip of a second elementary module.

Each elementary module also has at least one connection pad or pad for short, located on one edge of the support and connected to the chip by means of the interconnection network, each pad being connected to the pads of adjacent elementary modules (upper module and lower module) in order to ensure an electrical connection between the elementary modules.

According to the invention, the elementary modules placed substantially on one another are displaced with respect to one another in such a way that the pads of each support are not covered by the support of the upper elementary module, so as to permit the connection of electric wires in said pads.

According to an embodiment of the invention each elementary module has a plurality of chips interconnected by means of the interconnection network.

Other advantages and features of the invention can be gathered from the following illustrative and non-limitative description with reference to the attached drawings, wherein show:

FIG. 1 A three-dimensional multichip module having five levels.

Figure 2:
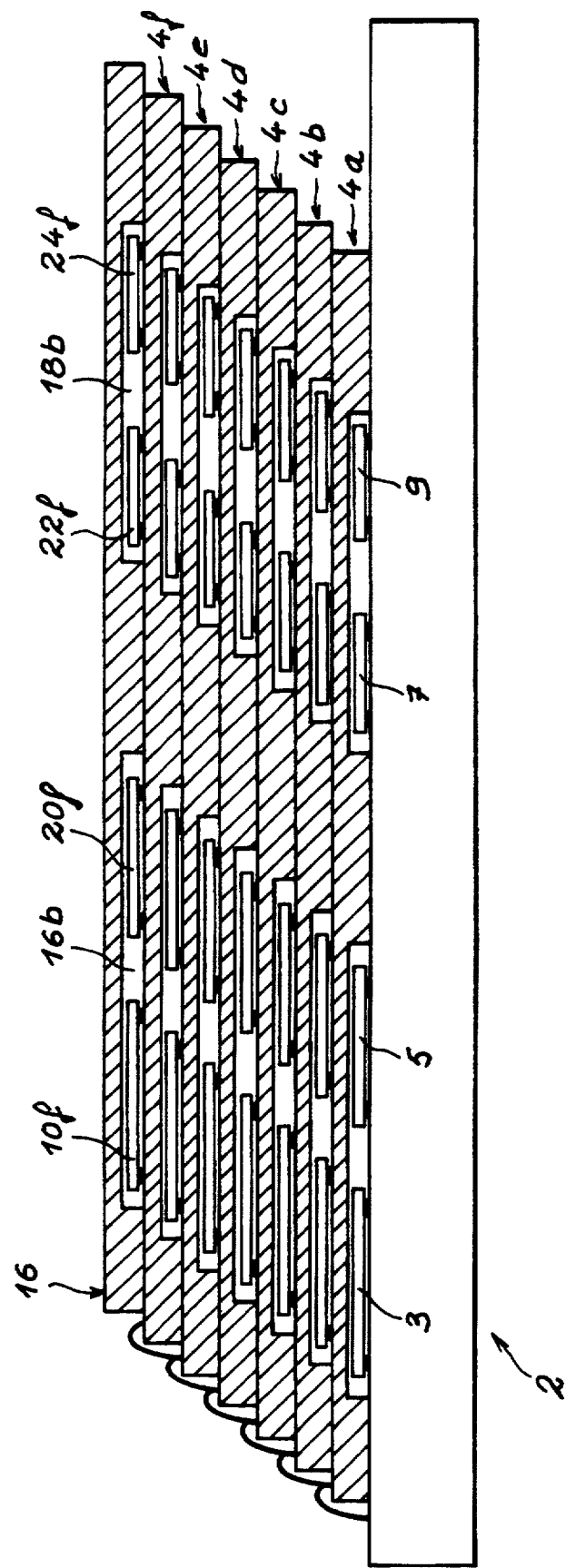

FIG. 2 Diagrammatically a three-dimensional multichip module having seven levels and in which each elementary module has a plurality of chips.

Figure 3A:
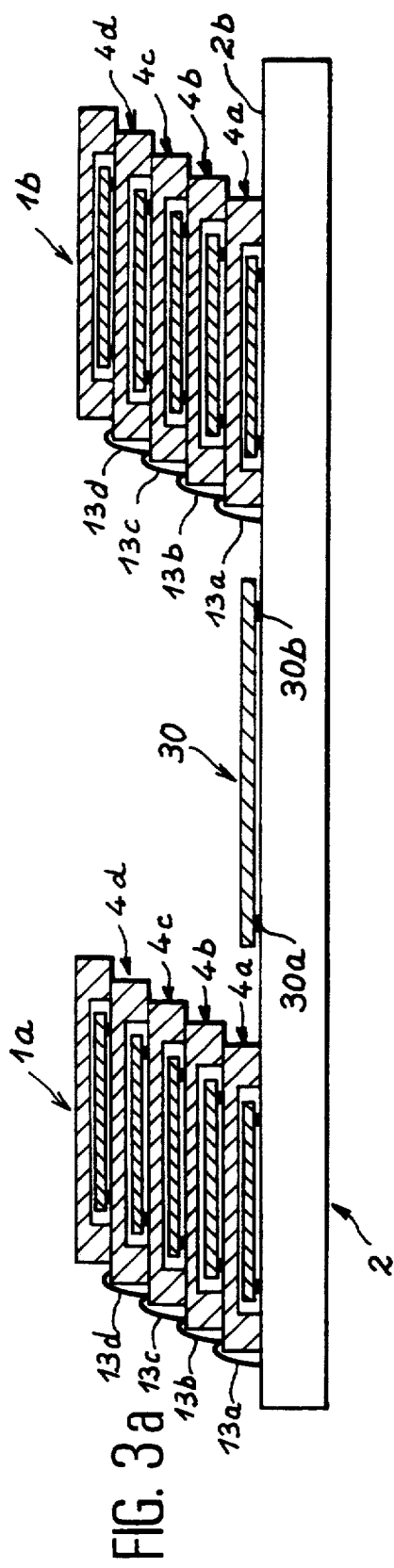
Figure 3B:
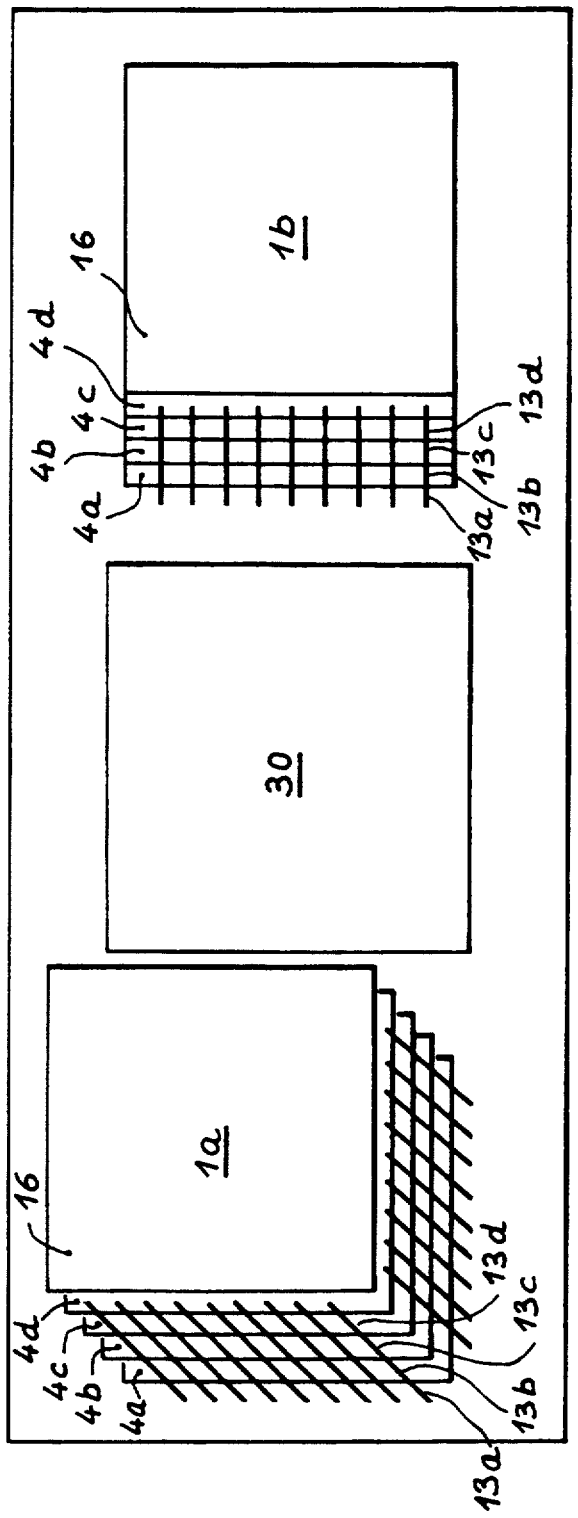

FIGS. 3a and 3b Respectively a profile view and a plan view, an integrated circuit incorporating a microprocessor associated with two three-dimensional multichip modules.

FIG. 1 shows a three-dimensional multichip module 1, which will be referred to hereinafter as a "3D module" for short. The 3D module of FIG. 1 has five levels, i.e. it has four elementary modules 4a, 4b, 4c, 4d assembled on an interconnection substrate 2, a chip hybridization 3 placed on the substrate 2 and a cover 16 encapsulating the final chip stage, namely the chip 10d of the elementary module 4d.

According to the embodiment shown in FIG. 1 all the elementary modules, namely modules 4a, 4b, 4c and 4d are identical to one another. In order to simplify the description, only the elementary module 4a will be described in detail, because all the other elementary modules 4b, 4c and 4d are identical to said module 4a.

This elementary module 4a has a support 6a, whose upper surface is covered by an interconnection network or array 8a. On said interconnection network 8a is placed a chip 10a, which is connected to the interconnection network 8a by means of connections 11a and 11a'.

The elementary modules 4a, 4b, 4c, 4d are superimposed in the manner of a staircase, i.e. the module 4b is placed on the module 4a so as to be slightly displaced with respect to the edge of the module 4a. Thus, that part of the support 6a and that part of the interconnection network 8a which are not covered by the elementary module 4b have at least one connection pad 12a. Thus, each elementary module 4a, 4b, 4c, 4d has on its upper surface (i.e. level with its interconnection network respectively 8a, 8b, 8c, 8d) a connection pad respectively 12a, 12b, 12c, 12d making it possible to connect, by means of the wires 13a, 13b, 13c, 13d, the different modules to one another.

These interconnection pads are connected to the chips by means of the interconnection network. Thus, each chip can be connected to the neighbouring chips by means of the interconnection network and then the connection pads of its module and finally a connecting wire connecting each connection pad of its module to a connecting pad of one of the neighbouring modules.

The use of filamentary wiring for the electrical interconnection of the elementary modules makes it possible to use relay pads when the need exists. These relay pads are placed on portions of elementary modules which are not covered by other elementary modules and are not connected to the interconnection network of the support to which they are fixed. In the case of the 3D memory modules, such relay pads permit the individualization of certain equipotential levels (such as chip select or write enable).

In order to permit a better superimposed "stacking" of the elementary modules, each support 6a, 6b, 6c, 6d has a cavity respectively 14a, 14b, 14c, 14d having a slightly larger size than that of the chip of the lower module. For example, the elementary module 4b has a cavity 14b making it possible to stack said module 4b on the elementary module 4a.

In addition, said three-dimensional multichip module has a substrate 2 on which is placed the elementary module array. This substrate 2 has a support 2a covered by an interconnection network 2b of the same type as the interconnection networks of the elementary modules. In the same way, said substrate has at least one connection pad 2c which, by means of the connecting wire 13a, permits an electrical connection between said substrate 2 and the elementary module 4a and more specifically between the substrate and the chip 10a of said module 4a.

On said substrate 2 is placed a chip 3 connected to the interconnection network 2c by means of its connections 3a and 3b. This substrate 2/chip 3 array constitutes what was called hereinbefore "the hybridization of the chip on the substrate".

This 3D multichip module also has a cover or cap 16 making it possible to encapsulate the final chip level. More specifically, said cover has a portion 16a made from a material which can be identical to that of the supports 6a, 6b, 6c, 6d. It also has a cavity 16b with a size slightly greater than that of the chip 10d which it covers.

According to another embodiment of the invention, the cavities 14a, 14b, 14c, 14d of the supports of the elementary modules and the cavity 16b of the cover 16 can be replaced by a spacer.

In the case of the cavity described hereinbefore, it is produced either by wet etching, or by dry etching (e.g. plasma etching) if the supports 6a, 6b, 6c, 6d and the cover 16a are made from silicon. If the said supports and the said cover are made from a material other than silicon, the etching type will be chosen as a function of the nature of the materials used.

The interconnection networks of the elementary modules and the substrate 2 will not be described in greater detail, because they are identical to the interconnection networks of the bidimensional multichip modules. They are therefore produced by the deposition and etching of conductive materials for the interconnection lines and mineral or organic insulants for the coating of said lines. In addition, these interconnection networks can be made from metallic materials (for the interconnection lines) and e.g. silica or polyimides (for the coating of said lines).

According to an embodiment of these interconnection networks, the structure thereof is of the multilayer type, which makes it possible to obtain integrated decoupling capacitances between e.g. the body of the elementary module which can be grounded and a metallic layer deposited on a thin dielectric film ($SiO_2$), which is itself deposited on the upper planar face of the module.

FIG. 2 shows a 3D module with seven stages or levels, i.e. a 3D module having six elementary modules 4a to 4f and a chip hybridization 3, 5, 7, 9 on the substrate 2.

The references in FIG. 2 are identical to those in FIG. 1 and each refers to an identical element. For example, the 3D module in FIG. 2 comprises the elementary modules 4a, 4b, 4c, 4d already shown in FIG. 1 and elementary modules 4e and 4f representing the two supplementary stages compared with the 3D module of FIG. 1.

In FIG. 2, each elementary module has four chips 10f, 10f, 22f, 24f for the chips of the elementary modules 4f. In order to permit the stacking of the different elementary modules on one another, each elementary module support has a plurality of cavities 16b and 18b for the cavities produced in the cover 16.

According to another embodiment of the invention, each of the supports and cover only has one large cavity in which all the chips of the lower elementary module can be introduced.

Each elementary module is not described in detail with respect to said drawing, because each of the said modules is produced identically to the already described module 4f.

It is clear that although FIG. 2 shows elementary modules with four chips on one side (i.e. 16 chips if the elementary module is square), said elementary modules forming the 3D module can, for other embodiments, have four, nine or n chips (n being an integer).

FIGS. 3a and 3b show an integrated circuit having a microprocessor associated with two 3D multichip modules. According to an exemplified application of this integrated circuit, the 3D multichip modules can be 3D memory modules. FIG. 3a shows this integrated circuit in profile view and FIG. 3b in plan view.

In FIG. 3a it is possible to see two 3D modules of the same type as the module 1 in FIG. 1. These two modules are designated 1a and 1b. FIG. 3a also shows the microprocessor 30 associated with the three-dimensional multichip modules 1a and 1b. This microprocessor 30 is connected to the interconnection network 2b of the substrate 2 by means of connections 30a, 30b. Thus, said interconnection network 2b makes it possible to electrically connect the chips of the module 1a and the chips of the module 1b to said microprocessor 30.

In this embodiment, as stated hereinbefore, the 3D modules 1a and 1b are memory modules. Obviously, these modules 1a and 1b can be modules other than memory modules.

FIG. 3a will not be described in greater detail, because the description of the 3D modules shown therein has already been given relative to FIG. 1 and the microprocessor 30 can be looked upon as a bidimensional module connected to the substrate 2.

FIG. 3b shows the same embodiment as FIG. 3a, but in a plan view. Thus, in FIG. 3b it is possible to see that the 3D multichip module 1a has a displacement in two directions, i.e. each elementary module is displaced with respect to the lower elementary module on two sides of said module. Moreover, the 3D multichip module 1b only has a displacement in one direction.

More specifically, FIG. 3b shows the cover 16 of the three-dimensional multichip module 1a, the borders containing the connection pads of the elementary modules 4d, 4c, 4b, 4a. It is also possible to see the connecting wires 13a, 13b, 13c, 13d for respectively connecting the chips of the elementary modules 4a and the substrate 2, the chips of the elementary module 4a with the chips of the elementary module 4b, the chips of the elementary module 4b with the chips of the elementary module 4c and the chips of the elementary module 4c with the chips of the elementary module 4d. Thus, there are the same number of connecting wires between two elementary modules as there are connection pads on the modules.

This plan view of the 3D multichip module demonstrates the displacement in two directions of each elementary module with respect to the lower elementary module. Therefore it makes it clear that when such a 3D multichip module has a displacement in two directions, the number of connecting pads between the elementary modules can be twice the number of connecting pads of a 3D multichip module having a single displacement, as shown at 1b in the same drawing.

It will be readily apparent that although FIGS. 1, 2, 3a and 3b show a chip hybridization on the substrate, it is possible in a simpler embodiment to only use one substrate on which there is a plurality of elementary modules.

No matter what the embodiment of the invention (with a hybridization, or with a substrate), these elementary modules are assembled with one another by bonding or by hard soldering. The same applies with regards to the cover 16, which is assembled with the final elementary module by a method identical to the assembly of said elementary modules.

Thus, these three-dimensional multichip modules are produced on the basis of easily performable processes, because the technologies used are already known and employed, particularly for bidimensional modules.

The supports, covers and substrates can be made from identical or different materials. The choice of a material such as silicon offers the possibility for the said elements to be made or not made from a semi-conductor as a function of the doping.

When the supports and covers are made from silicon, it is advantageous to make the substrate from silicon, so as in simple manner to avoid the problems resulting from the expansion of these different elements.

In addition, silicon has the special feature of being a relatively good electrical conductor when highly doped. The use of doped silicon for producing the elementary modules and the substrate makes it possible to have equipotential planes (e.g. a ground or earth plane) within the device.

The use of silicon for producing the elementary modules and the substrate and the anisotropic chemical etching of this material also make it possible to produce sloping cavities in accordance with crystallographic planes and very precise dimensions, which ensures a self-alignment of the elementary modules on the chips installed by the flip-chip process during assembly.

According to the invention, each elementary module of the 3D module can be independently tested. In addition, each of the chips can be repaired separately of the other chips of the 3D module.

Moreover, the number of assemblable elementary modules varies as a function of needs and it is possible to interconnect different types of chips. It is also possible to produce a system entirely integrated in a 3D module.

We claim:

1. Multichip module having a substrate (2) and plurality of bidimensional, elementary electronic modules (4a–4d), each having at least one chip (10–10d) and a support (6a–6d) on which is placed the chip, the elementary modules being substantially superimposed and deposited on the substrate, characterized in that the substrate and the supports of the elementary modules have in each case an upper face covered by an interconnection network and in that the elementary modules which are substantially superimposed are displaced with respect to one another and with respect to the substrate in such a way that a portion of each interconnection network is not covered by the support of an upper elementary module, so as to permit the interconnection of the interconnection networks by electric wires.

2. Multichip module according to claim 1, characterized in that, on a lower face, the supports have a cavity (14a–14d) with a size significantly greater than that of the chips, so that the support of a first elementary module can be placed above the chip of a second elementary module.

3. Multichip module according to claim 1, characterized in that each elementary module has at least one connecting pad (12a–12d) placed on one edge of the support and connected to the chip by means of the interconnection network, each connecting pad being connected to the connecting pads of the upper and lower elementary modules in order to ensure an electrical connection between said elementary modules.

4. Multichip module according to claim 1, characterized in that each elementary module has a plurality of chips connected to one another by means of the interconnection network.

* * * * *